(12) United States Patent
Bulatowicz

(10) Patent No.: US 11,474,175 B2
(45) Date of Patent: Oct. 18, 2022

(54) HEATER SYSTEM WITH MAGNETIC FIELD SUPPRESSION

(71) Applicant: Michael D. Bulatowicz, Sun Prairie, WI (US)

(72) Inventor: Michael D. Bulatowicz, Sun Prairie, WI (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 16/741,302

(22) Filed: Jan. 13, 2020

(65) Prior Publication Data

US 2021/0215779 A1 Jul. 15, 2021

(51) Int. Cl.
*G01R 33/38* (2006.01)
*G01R 33/26* (2006.01)
*H05B 3/03* (2006.01)
*H05B 3/06* (2006.01)

(52) U.S. Cl.
CPC ......... *G01R 33/3804* (2013.01); *G01R 33/26* (2013.01); *H05B 3/03* (2013.01); *H05B 3/06* (2013.01)

(58) Field of Classification Search
USPC ....................................................... 324/306
See application file for complete search history.

(56) References Cited

U.S. PATENT DOCUMENTS

| 8,138,760 | B2 | 3/2012 | Bulatowicz | |
| 8,319,156 | B2* | 11/2012 | Borwick, III | G04F 5/14 219/482 |
| 9,112,518 | B2 | 8/2015 | Adachi et al. | |
| 10,080,258 | B2 | 9/2018 | Mohageg et al. | |
| 2009/0316753 | A1* | 12/2009 | Bulatowicz | G01R 33/31 374/185 |
| 2014/0009149 | A1 | 1/2014 | Korth et al. | |

FOREIGN PATENT DOCUMENTS

CN 105589983 A 5/2016

OTHER PUBLICATIONS

Extended European Search Report for corresponding EP20209834.9-1126.

(Continued)

*Primary Examiner* — Rodney E Fuller
(74) *Attorney, Agent, or Firm* — Tarolli, Sundheim, Covell & Tummino LLP

(57) ABSTRACT

A heater system includes a current source configured to generate an input current and to receive a return current. The system also includes a heater configured to generate heat in response to the input current. The system further includes a plurality of current lead wires interconnecting the current source and the heater and being configured to provide the input current to the heater and to conduct the return current from the heater. Each of the plurality of current lead wires is arranged on a separate substrate layer such that each of the plurality of current lead wires are each spaced apart from each other. At least one of the input current and the return current is divided to be conducted on two or more of the plurality of current lead wires.

20 Claims, 2 Drawing Sheets

(56) References Cited

OTHER PUBLICATIONS

Yim et al.: "Note: Double-Layered Polyimide Film Heater with Low Magnetic Field Generation"; Review of Scientific Instruments 89, 116102 (2018), vo. 89, No. 11, Nov. 6, 2018, XP012233026, ISSN: 0034-6748, DOI: 10.1063/1.5040398 [retrieved on Nov. 6, 2018] *whole document.
Noor et al.: "A Status on Components Development for Folded Micro NMR Gyro"; 2017 IEEE International Symposium on Inertial Sensors and Systems, IEEE, Mar. 27, 2017, pp. 156-159, XP033100385, DOI: 10.1109/ISISS.2017.7935691 [retrieved on May 30, 2017]; *p. 157, left-hand column—paragraph 2.
Schwindt et al.: "Chip-scale Atomic Magnetometer"; Technical Digest CD-ROM/Conference on Lasers and Electro-Optics, Quantum Electronics and Laser Science Conference, Conference on Photonic Applications, Systems and Technologies: Long Beach Convention Center, Long Beach CA, USA; CLEO/QELS, May 21, 2006, pp. 1-2, XP031395383, ISBN: 978-1-55752-813-1 *p. 2, paragraph 2*.

* cited by examiner

ABSTRACT# HEATER SYSTEM WITH MAGNETIC FIELD SUPPRESSION

GOVERNMENT INTEREST

The invention was made under Government Contract. Therefore, the US Government has rights to the invention as specified in that contract.

TECHNICAL FIELD

The present invention relates generally to temperature control systems, and specifically to a heater system with magnetic field suppression.

BACKGROUND

A broad range of technical fields involve electromagnetically sensitive temperature controlled environments. For example, Nuclear Magnetic Resonance (NMR) is a technique for obtaining information about atoms and molecules. NMR operates on atoms having nuclei in which at least one proton or neutron is unpaired and NMR measurements are often conducted in a temperature controlled environment. The imbalance in the spins of the nucleons (protons and neutrons) causes the nuclei to exhibit a property of net spin by which the nuclei exhibit angular momentum and a magnetic moment. Similarly, unpaired electrons in the electron clouds of atoms exhibit a net spin with the same consequences; an example of a system which relies on measurements based on the net spin of unpaired electrons is an alkali vapor magnetometer. When exposed to an external magnetic field, these "spinning magnets" attempt to align their axes along the lines of magnetic force; if the magnetic field is not parallel to the magnetic moments of the spins (nuclear spin or electron spin), the spins will precess about the field. Therefore, spin-based detection systems, such as NMR gyroscopes and alkali vapor magnetometers, are sensitive to electromagnetic interference. Extraneous electromagnetic fields can often cause an NMR gyroscope or alkali vapor magnetometer to exceed its intersystem magnetic tolerance.

SUMMARY

One embodiment includes a heater system. The system includes a current source configured to generate an input current and to receive a return current. The system also includes a heater configured to generate heat in response to the input current. The system further includes a plurality of current lead wires interconnecting the current source and the heater and being configured to provide the input current to the heater and to conduct the return current from the heater. Each of the plurality of current lead wires is arranged on a separate substrate layer such that each of the plurality of current lead wires are each spaced apart from each other. At least one of the input current and the return current is divided to be conducted on two or more of the plurality of current lead wires.

Another embodiment includes a heater system. The system includes a current source configured to generate an input current and to receive a return current. The system also includes a heater configured to generate heat in response to the input current. The system also includes a first current lead wire arranged on a first substrate layer, a second current lead wire arranged on a second substrate layer, and a third current lead wire arranged on a third substrate layer. The first current lead wire is arranged between the second and third current lead wires. The first current lead wire is configured to conduct one of the input current and the return current and the second and third lead wires are each configured to conduct a portion of the other of the input current and the return current.

Another embodiment includes a nuclear magnetic resonance (NMR) sensor system. The system includes a magnetic field generator configured to generate a magnetic field, and a pump laser configured to generate a pump beam. The system also includes a sensor cell comprising an alkali metal vapor that is configured to precess in response to the magnetic field and the pump beam. The system also includes a probe laser configured to provide a probe beam through the sensor cell to facilitate measurement of at least one measurable parameter associated with the NMR sensor system. The system also includes a heater system. The heater system includes a current source configured to generate an input current and to receive a return current and a heater arranged proximal with the sensor cell to generate heat for the alkali metal vapor in response to the input current. The heater system also includes a plurality of current lead wires interconnecting the current source and the heater and being configured to provide the input current to the heater and to conduct the return current from the heater. Each of the plurality of current lead wires is arranged on a separate substrate layer such that each of the plurality of current lead wires are each spaced apart from each other. At least one of the input current and the return current is divided to be conducted on two or more of the plurality of current lead wires.

DETAILED DESCRIPTION

The present invention relates generally to temperature control systems, and specifically to a heater system with magnetic field suppression. The heater system can include a current source that is configured to generate an input current and to receive a return current. As an example, the input current can be an AC current. The heater system also includes a heater that generates heat in response to the input current, and thus provides the return current back to the current source. The input current and the return current can be conducted on a plurality of current lead wires that can split the amplitude of at least one of the input current and the return current. The plurality of current lead wires can each be arranged on a separate substrate layer, such that the plurality of current lead wires can be spaced apart from each other by a predetermined distance (e.g., approximately equal predetermined distances). As a result, the magnetic field that is generated by the input current and the return current conducted on the current lead wires can have an amplitude that can decreases rapidly as a function of distance.

For example, the current lead wires can include a first current lead wire that is configured to conduct one of the input current and the return current, a second current lead wire that is configured to conduct a first portion of the other of the input current and the return current, and a third current lead wire that is configured to conduct a second portion of the other of the input current and the return current. As an example, the first current lead wire can be arranged on a first substrate layer, and the second and third current lead wires can be arranged on respective second and third substrate layers, such that the first substrate layer is arranged between the second and third substrate layers. For example, the heater system can be implemented in an NMR sensor system (e.g., an NMR gyroscope system or an alkali vapor magnetometer). Therefore, based on the magnetic field cancellation arrangement of the heater system, the effect of the magnetic field of the input and return currents on the precession of the alkali metal atoms in the NMR sensor system can be substantially mitigated.

Figure 1:
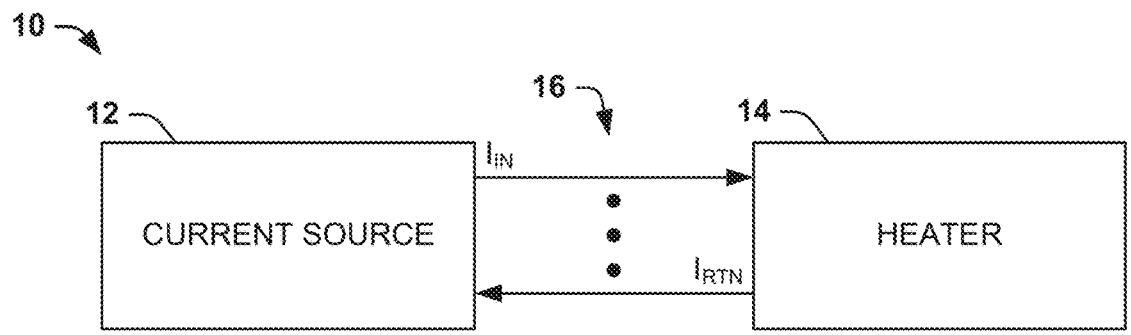
FIG. 1 illustrates an example diagram of a heater system.

FIG. 1 illustrates an example diagram of a heater system 10. The heater system 10 can be implemented in a variety of temperature control applications in which mitigating magnetic fields can be an important consideration. For example, the heater system 10 can be implemented in an NMR sensor system to provide thermal control of an alkali metal vapor while mitigating the effects of spurious magnetic fields on the precession of the alkali metal vapor atoms. As described herein, an NMR sensor system can refer to an NMR gyroscope, an alkali vapor magnetometer, or any of a variety of other types of spin-based detection sensors.

The heater system 10 includes a current source 12 that is configured to generate an input current $I_{IN}$. The input current $I_{IN}$ is provided to a heater 14 that is configured to generate heat in response to the input current $I_{IN}$. As an example, the heater 14 can include an electrical conductor that emits heat as the input current $I_{IN}$ flows through the electrical conductor. In the example of FIG. 1, the heater 14 provides a return current $I_{RTN}$ back to the current source 12, which can correspond to a ground connection for the input current $I_{IN}$. For example, the input current $I_{IN}$ and the return current $I_{RTN}$ can be associated with the same current path, such that the return current $I_{RTN}$ is provided back to the current source 12 from the heater 14 as a return path for the input current $I_{IN}$. As an example, the input current $I_{IN}$ can be an AC current, such as to substantially mitigate first order magnetic fields occurring in response to the input current $I_{IN}$ and the return current $I_{RTN}$.

The input current $I_{IN}$ and the return current $I_{RTN}$ can be conducted on a plurality of current lead wires, demonstrated in the example of FIG. 1 at 16, with the plurality being greater than two. As a result, the current lead wires 16 can split the amplitude of at least one of the input current $I_{IN}$ and the return current $I_{RTN}$. As an example, the current lead wires 16 can be arranged on separate respective substrate layers. As a result, the current lead wires 16 can be spaced apart from each other by a predetermined distance (e.g., approximately equal predetermined distances) based on the respective substrate layers. As a result, the magnetic field that is generated by the input current $I_{IN}$ and the return current $I_{RTN}$ conducted on the current lead wires 16 can have an amplitude that can decreases rapidly as a function of distance.

Figure 2:
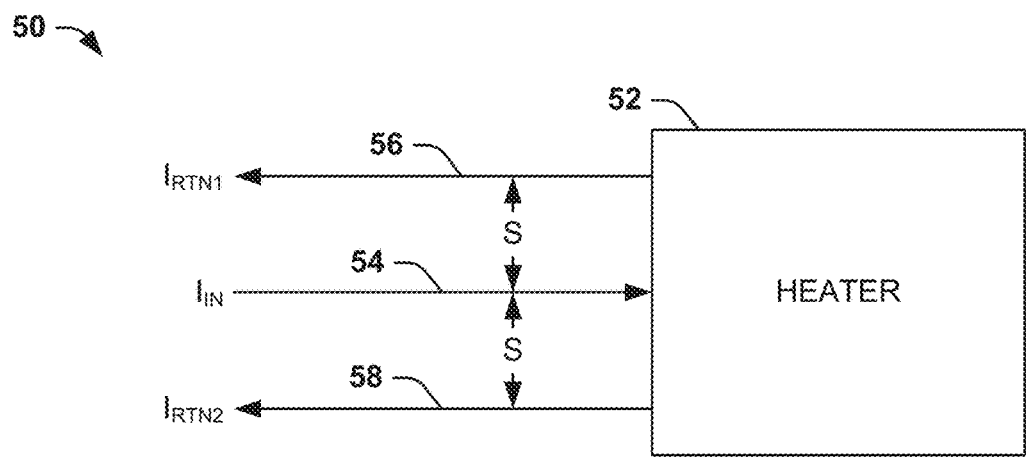
FIG. 2 illustrates another example diagram of a heater system.

FIG. 2 illustrates another example diagram of a heater system 50. The heater system 50 can correspond to the heater system 10 in the example of FIG. 1. Therefore, the heater system 50 can provide temperature control while mitigating spurious magnetic fields, such as for an NMR sensor system.

The heater system 50 includes a heater 52 that is configured to generate heat in response to an input current $I_{IN}$. As an example, the heater 54 can include an electrical conductor that emits heat as the input current $I_{IN}$ flows through the electrical conductor. For example, the electrical conductor can correspond to a pattern that provides a relatively long current path of the input current $I_{IN}$ in a manner that substantially mitigates the generation of magnetic field. As an example, the heater 52 can correspond to a heater described in U.S. Pat. No. 8,138,760, which is incorporated by reference herein in its entirety. The heater 52 also provides a return current (e.g., from the heat generating electrical conductor), which can be provided back to a ground connection. For example, the input current $I_{IN}$ and the return current can be associated with the same current path, such that the return current is a return path for the input current $I_{IN}$. As an example, the input current $I_{IN}$ can be an AC current, such as to substantially mitigate first order magnetic fields occurring in response to the input current $I_{IN}$ and the return current.

In the example of FIG. 2, the input current $I_{IN}$ is provided to the heater 52 on a first current lead wire 54. In addition, a first portion of the return current, demonstrated $I_{RTN1}$, is conducted from the heater 52 on a second current lead wire 56 and a second portion of the return current, demonstrated $I_{RTN2}$, is conducted from the heater 52 on a third current lead wire 58. For example, the first and second portions of the return current $I_{RTN1}$ and $I_{RTN2}$ (also referred to collectively herein as the return current $I_{RTN}$) can have approximately equal amplitudes. As an example, the current lead wires 54, 56, and 58 can be arranged on separate respective substrate layers. In the example of FIG. 2, the current lead wires 54, 56, and 58 are demonstrated such that the first current lead wire 54 is arranged between the second and third current lead wires 56 and 58, such as based on a respective arrangement of the substrate layers. Also as demonstrated in the example of FIG. 2, the first current lead wire 54 is spaced apart from the second current lead wire 56 by a predetermined distance "S", and the first current lead wire 54 is spaced apart from the third current lead wire 58 by the predetermined distance "S". As a result, the magnetic field that is generated by the input current $I_{IN}$ and the portions of the return current $I_{RTN1}$ and $I_{RTN2}$ conducted on the current lead wires 54, 56, and 58 can have an amplitude that can decreases rapidly as a function of distance.

While the input current $I_{IN}$ and the portions of the return current $I_{RTN1}$ and $I_{RTN2}$ are demonstrated as three current lead wires with one current lead wire associated with the input current $I_{IN}$ and two current lead wires associated with the return current $I_{RTN}$, it is to be understood that alternative arrangements can be provided. For example, the current directions can be reversed relative to as demonstrated in the example of FIG. 2. Therefore, the input current $I_{IN}$ can be divided and provided to the heater 52 as portions on separate current lead wires, and the return current $I_{RTN}$ can be provided from the heater 52 on a single current lead wire (e.g., between the current lead wires on which the portions of the input current $I_{IN}$). As another example, the plurality of current lead wires can exceed three, such that multiple current lead wires can conduct portions of both the input current $I_{IN}$ and the return current $I_{RTN}$, with the current lead wires being interleaved with respect to each other as to current direction. As another example described in greater detail herein, the current lead wires can occupy one or more of the same substrate layers as multiple substrate layers associated with the heater 52. Accordingly, the heater system 50 can be arranged in any of a variety of ways.

Figure 3:
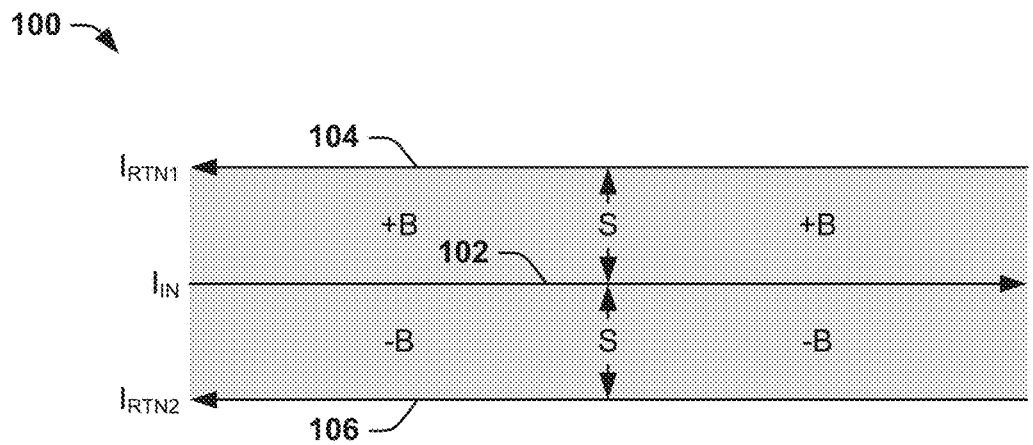
FIG. 3 illustrates an example diagram of lead wires of a heater system.

FIG. 3 illustrates an example diagram 100 of lead wires of a heater system. The diagram 100 demonstrates a first current lead wire 102, a second current lead wire 104, and a third current lead wire 106. The current lead wires 102, 104, and 106 can correspond to the current lead wires 54, 56, and 58, respectively, in the example of FIG. 2. Therefore, reference is to be made to the example of FIG. 2 in the following description of the example of FIG. 3.

In the example of FIG. 3, similar to the example of FIG. 2, the input current $I_{IN}$ is provided to the heater 52 on the first current lead wire 102, and the portions of the return current $I_{RTN1}$ and $I_{RTN2}$ are conducted from the heater 52 on the second and third current lead wires 104 and 106, respectively. For example, the first and second portions of the return current $I_{RTN1}$ and $I_{RTN2}$ can have approximately equal amplitudes. Additionally, the first current lead wire 102 is spaced apart from the second current lead wire 104 by a predetermined distance "S", and the first current lead wire 102 is spaced apart from the third current lead wire 106 by the predetermined distance "S". Therefore, in the example of FIG. 3, magnetic dipoles are generated between the first current lead wire 102 and the second and third current lead wires 104 and 106, respectively, based on the flow of the input current $I_{IN}$ and the portions of the return current $I_{RTN1}$ and $I_{RTN2}$.

In the example of FIG. 3, a first magnetic dipole "+B" is demonstrated between the first current lead wire 102 and the second current lead wire 104. Similarly, a second magnetic dipole "−B" is demonstrated between the first current lead wire 102 and the third current lead wire 106. The magnetic dipoles "+B" and "−B" can have opposite polarities with respect to each other. As an example, because the amplitude of the return current $I_{RTN}$ can be split as the separate respective portions (e.g., the first and second portions $I_{RTN1}$ and $I_{RTN2}$ of approximate equal amplitude), the magnetic dipoles "+B" and "−B" can each have a magnitude that is approximately half the magnitude of a magnetic dipole generated by a single current lead wire for each of the input current and return current, such as provided in typical heater systems. Additionally, the arrangement of the current lead wires 102, 104, and 106 can provide for additional cancellation of the magnetic fields at distances greater than the predetermined distance "S". For example, a residual magnetic field $B_{d,pi}$ that is generated by the current lead wires 102, 104, and 106, can be expressed as follows:

$$\vec{B}_{d,pi} \propto \frac{1}{r^4} \approx \vec{B}_{d,pa} * \frac{1}{2r} \quad \text{Equation 1}$$

Where: r is an arbitrary distance from the first current lead wire 102 (e.g., r>>"S"); and $B_{d,pa}$ is a residual magnetic field of a typical heater system that implements single current lead wires for both the input current and the return current.

Therefore, Equation 1 demonstrates that the heater system 50 exhibits significantly greater cancellation of the residual magnetic field $B_{d,pi}$ relative to a typical heater system.

Figure 4:
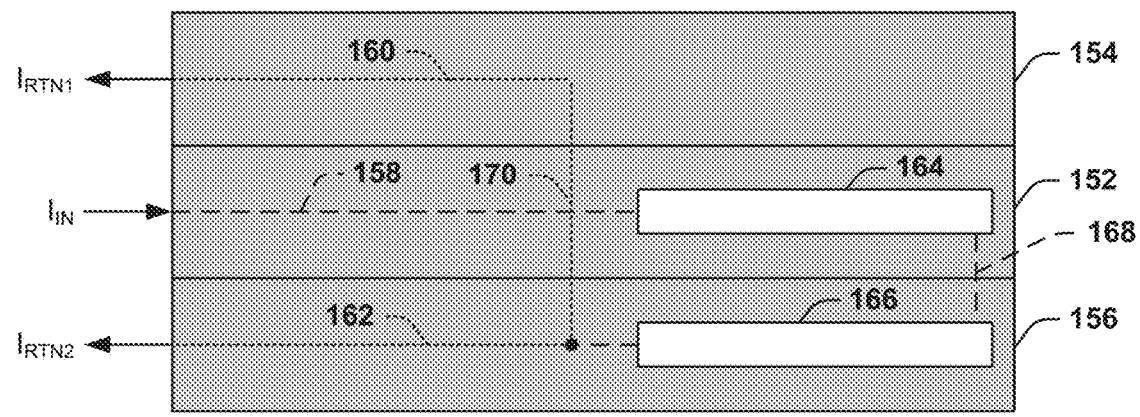
FIG. 4 illustrates yet another example of a heater system.

FIG. 4 illustrates another example diagram of a heater system 150. The heater system 150 can correspond to the heater systems 10 or 50 in the respective examples of FIGS. 1 and 2. Therefore, the heater system 150 can provide temperature control while mitigating spurious magnetic fields, such as for an NMR sensor system.

The heater system 150 includes a first substrate layer 152, a second substrate layer 154, and a third substrate layer 156. The substrate layers 152, 154, and 156 are arranged in a stack with respect to each other. In the example of FIG. 4, the second substrate layer 154 is coupled to a first surface of the first substrate layer 152 and the third substrate layer 156 is coupled to a second surface of the first substrate layer 152 opposite the first surface, such that the first substrate layer 152 is arranged between the second and third substrate layers 154 and 156. The heater system 150 also includes a first current lead wire 158, a second current lead wire 160, and a third current lead wire 162 that are disposed in the substrate layers 152, 154, and 156. In the example of FIG. 4, the first current lead wire 158 is disposed in the first substrate layer 152, the second current lead wire 160 is disposed in the second substrate layer 154, and the third current lead wire 162 is disposed in the third substrate layer 156. As an example, each of the cherries 152, 154, and 156 can be arranged as multiple sub-layers of a given substrate material (e.g., a dielectric, such as silicon oxide), such that the current lead wires 158, 160, and 162 can be patterned on a surface of a given one of the sub-layers of the respective current lead wires 158, 160, and 162.

In addition, the heater system 150 includes a first heater portion 164 and a second heater portion 166 that collectively form a heater (e.g., the heater 52). As an example, the heater portions 164 and 166 can correspond to a patterned electrical conductor that provides a relatively long current path of the input current $I_{IN}$ in a manner that substantially mitigates the generation of magnetic field and emits heat as the input current $I_{IN}$ flows through the patterned electrical conductor. For example, the patterned electrical conductor can correspond to the patterned electrical conductor described in U.S. Pat. No. 8,138,760. In the example of FIG. 4, the first heater portion 164 is arranged on the first substrate layer 152 and the second heater portion 166 is arranged on the second substrate layer 154, such as on surface(s) of respective sub-layers of the substrate layers 152 and 154. The heater portions 164 and 166 are electrically connected by a first via 168 that extends between the first and third substrate layers 154 and 156.

In the example of FIG. 4, the input current $I_{IN}$ is provided to the first heater portion 164 from the first current lead wire 158. The input current $I_{IN}$ thus flows through the first heater portion 164 through the first via 168 to the second heater portion 166. The input current $I_{IN}$ can thus flow through the second heater portion 166, such that the input current $I_{IN}$ is provided from the second heater portion 166 as the return current $I_{RTN}$. In the example of FIG. 4, the second and third current lead wires 158 and 160 are electrically connected by a second via 170. Therefore, after flowing from the second heater portion 166, the return current $I_{RTN}$ is split (e.g., in equal amplitudes) as the first portion $I_{RTN1}$ through the second via 170 to the second current lead wire 160 and as the second portion $I_{RTN2}$ on the third current lead wire 162. Therefore, the input current $I_{IN}$ and the return current portions $I_{RTN1}$ and $I_{RTN2}$ are associated with the same current path through the heater portions 164 and 166. As demonstrated in the example of FIG. 4, the portions of the current path that include the full amplitude of the input current $I_{IN}$ or return current $I_{RTN}$ are demonstrated as dashed lines, while the portions of the return current $I_{RTN1}$ and $I_{RTN2}$ that have approximately half the amplitude of the input current $I_{IN}$ or return current $I_{RTN}$ are demonstrated as dotted lines. The substrate layers 152, 154, and 156 can thus provide the suitable spacing (e.g., the distance "S") between the current lead wires 158, 160, and 162 to provide for mitigation of residual magnetic field.

Figure 5:
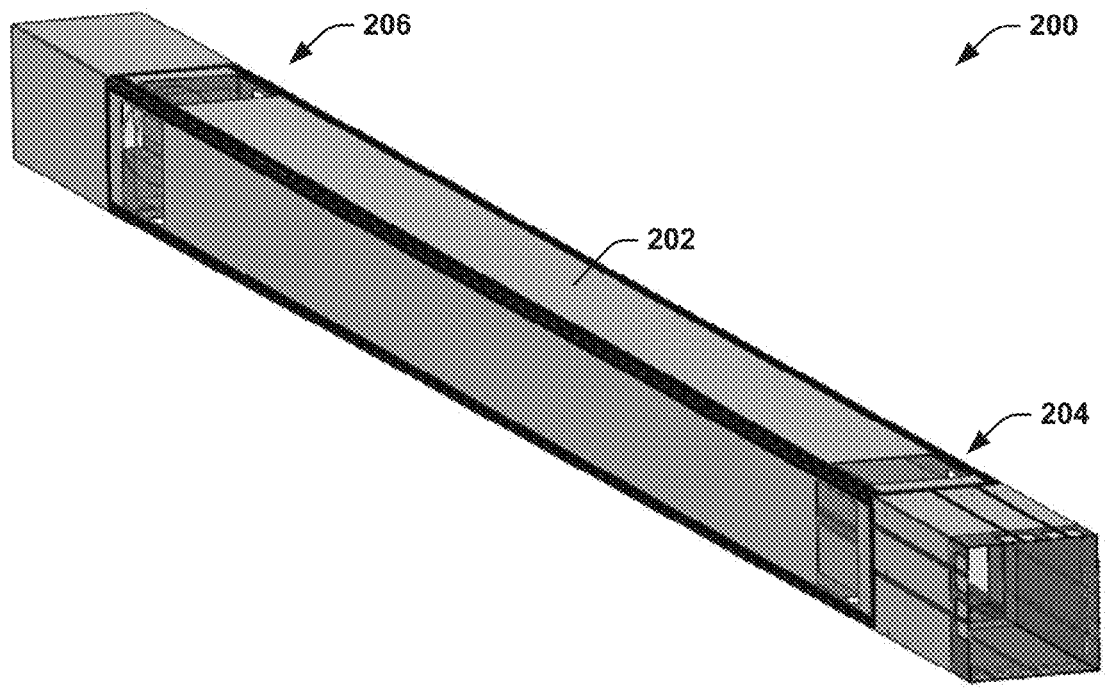
FIG. 5 illustrates an example of a sensor cell system.

FIG. 5 illustrates an example of a sensor cell system 200. The sensor cell system 200 can correspond to a sensor cell system for a Nuclear Magnetic Resonance (NMR) sensor, such as an NMR gyroscope. The sensor cell system 200 is demonstrated as including a case 202 that is demonstrated as an elongated tube with a rectangular (e.g., square) cross-section. The sensor cell system 200 can also include a sensor cell (not shown in the example of FIG. 5) that is enclosed by the case 202. The sensor cell can be filled with alkali metal vapor that is configured to precess in response to a magnetic field and a pump beam (e.g., circularly-polarized pump beam) generated by a pump laser. As an example, a probe beam (e.g., linearly-polarized probe beam) that is generated by a probe laser can be provide through the sensor cell through a first opening 204 and/or a second opening 206 in the case 202 to determine a measurable parameter (e.g., magnetic field and/or rotation) based on detecting the precession of the alkali metal vapor.

The case 202 can include one or more heater systems as described herein. For example, each of the four surfaces of the case 202 can include a separate heater system, such as the heater system 50 in the example of FIG. 2 or the heater system 150 in the example of FIG. 4. For example, the surfaces of the case 202 can each be formed from substrate materials, such as to form the substrate layers of the respective heater systems. As an example, each of the surfaces of the case 202 can be formed from three separate substrate layers, such as the substrate layers 152, 154, and 156 described in the example of FIG. 4, in which the heater portions 164 and 166 and the current lead wires 158, 160, and 162 are disposed. Therefore, the heater systems 150 can provide temperature control of the sensor cell system 200 (e.g., to maintain a predetermined temperature of the alkali metal vapor) in a manner that substantially mitigates spurious magnetic fields from affecting the precession of the alkali metal vapor in the respective sensor cell. As a result, the corresponding NMR sensor system can operate in a manner that is more accurate by mitigating errors associated with spurious residual magnetic fields caused by the input current $I_{IN}$ and the return current $I_{RTN}$ provided to the respective heater systems 150.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A heater system comprising:
   a current source configured to generate an input current and to receive a return current;
   a heater configured to generate heat in response to the input current; and
   a plurality of current lead wires interconnecting the current source and the heater and being configured to provide the input current to the heater and to conduct the return current from the heater, wherein each of the plurality of current lead wires is arranged on a separate substrate layer such that each of the plurality of current lead wires are each spaced apart from each other, wherein at least one of the input current and the return current is divided to be conducted on two or more of the plurality of current lead wires.

2. The system of claim 1, wherein the plurality of current lead wires comprises:
   a first current lead wire;
   a second current lead wire; and
   a third current lead wire, wherein the first current lead wire is arranged between the second and third current lead wires, wherein the first current lead wire is configured to conduct one of the input current and the return current and the second and third lead wires are each configured to conduct a portion of the other of the input current and the return current.

3. The system of claim 2, wherein the plurality of current lead wires comprises:
   a first current lead wire configured to provide the input current to the heater;
   a second current lead wire configured to provide a first portion of the return current from the heater; and
   a third current lead wire configured to provide a second portion of the return current from the heater.

4. The system of claim 2, wherein the plurality of current lead wires comprises:
   a first current lead wire configured to provide a first portion of the input current to the heater;
   a second current lead wire configured to provide a second portion of the input current to the heater; and
   a third current lead wire configured to provide the return current from the heater.

5. The system of claim 2, wherein the first current lead wire is spaced apart from the second current lead wire by a first predetermined distance, and the first current lead wire is spaced apart from the third current lead wire by a second predetermined distance that is approximately equal to the first predetermined distance.

6. The system of claim 5, wherein the arrangement of the first, second, and third current lead wires conducting the input current and the return current generates a first magnetic dipole in the first predetermined distance between the first current lead wire and the second current lead wire, and generates a second magnetic dipole in the second predetermined distance between the first current lead wire and the third current lead wire, the second magnetic dipole being equal and opposite with respect to the first magnetic dipole.

7. The system of claim 2, wherein the first current lead wire is arranged on a first substrate layer, the second current lead is arranged on a second substrate layer that is coupled to a first surface of the first substrate layer, and the third current lead is arranged on a third substrate layer that is coupled to a second surface of the first substrate layer opposite the first surface.

8. The system of claim 7, wherein the heater comprises:
   a first heating element arranged on the first substrate layer; and
   a second heating element arranged on the second substrate layer, wherein the input current is arranged to be conducted through the first heating element and through the second heating element by a via interconnecting the first substrate layer and the second substrate layer.

9. The system of claim 8, wherein the via is a first via, the system further comprising a second via that interconnects the third current lead wire on the third substrate layer to the second current lead wire on the second substrate layer through the first substrate layer.

10. The system of claim 7, wherein the heater comprises:
a first heating element arranged on the first substrate layer; and
a second heating element arranged on the second substrate layer, wherein the input current is arranged to be conducted through the first heating element and through the second heating element by a first via interconnecting the first substrate layer and the second substrate layer;
wherein the system further comprises a second via that interconnects the third current lead wire on the third substrate layer to the second current lead wire on the second substrate layer through the first substrate layer.

11. A Nuclear Magnetic Resonance (NMR) sensor system comprising the heater system of claim 1, the NMR sensor system further comprising:
a magnetic field generator configured to generate a magnetic field;
a pump laser configured to generate a pump beam;
a sensor cell comprising an alkali metal vapor that is configured to precess in response to the magnetic field and the pump beam, wherein the heater is arranged proximal with the sensor cell to heat the alkali metal vapor; and
a probe laser configured to provide a probe beam through the sensor cell to facilitate measurement of at least one measurable parameter associated with the NMR sensor system.

12. A heater system comprising:
a current source configured to generate an input current and to receive a return current;
a heater configured to generate heat in response to the input current;
a first current lead wire arranged on a first substrate layer;
a second current lead wire arranged on a second substrate layer; and
a third current lead wire arranged on a third substrate layer, wherein the first current lead wire is arranged between the second and third current lead wires, wherein the first current lead wire is configured to conduct one of the input current and the return current and the second and third lead wires are each configured to conduct a portion of the other of the input current and the return current.

13. The system of claim 12, wherein the first current lead wire is spaced apart from the second current lead wire by a first predetermined distance, and the first current lead wire is spaced apart from the third current lead wire by a second predetermined distance that is approximately equal to the first predetermined distance.

14. The system of claim 12, wherein the first current lead wire is arranged on a first substrate layer, the second current lead is arranged on a second substrate layer that is coupled to a first surface of the first substrate layer, and the third current lead is arranged on a third substrate layer that is coupled to a second surface of the first substrate layer opposite the first surface.

15. A Nuclear Magnetic Resonance (NMR) sensor system comprising the heater system of claim 12, the NMR sensor system further comprising:
a magnetic field generator configured to generate a magnetic field;
a pump laser configured to generate a pump beam;
a sensor cell comprising an alkali metal vapor that is configured to precess in response to the magnetic field and the pump beam, wherein the heater is arranged proximal with the sensor cell to heat the alkali metal vapor; and
a probe laser configured to provide a probe beam through the sensor cell to facilitate measurement of at least one measurable parameter associated with the NMR sensor system.

16. A Nuclear Magnetic Resonance (NMR) sensor system comprising:
a magnetic field generator configured to generate a magnetic field;
a pump laser configured to generate a pump beam;
a sensor cell comprising an alkali metal vapor that is configured to precess in response to the magnetic field and the pump beam;
a probe laser configured to provide a probe beam through the sensor cell to facilitate measurement of at least one measurable parameter associated with the NMR sensor system;
a heater system comprising:
a current source configured to generate an input current and to receive a return current;
a heater arranged proximal with the sensor cell to generate heat for the alkali metal vapor in response to the input current; and
a plurality of current lead wires interconnecting the current source and the heater and being configured to provide the input current to the heater and to conduct the return current from the heater, wherein each of the plurality of current lead wires is arranged on a separate substrate layer such that each of the plurality of current lead wires are each spaced apart from each other, wherein at least one of the input current and the return current is divided to be conducted on two or more of the plurality of current lead wires.

17. The system of claim 16, wherein the plurality of current lead wires comprises:
a first current lead wire;
a second current lead wire; and
a third current lead wire, wherein the first current lead wire is arranged between the second and third current lead wires, wherein the first current lead wire is configured to conduct one of the input current and the return current and the second and third lead wires are each configured to conduct a portion of the other of the input current and the return current.

18. The system of claim 16, wherein the first current lead wire is spaced apart from the second current lead wire by a first predetermined distance, and the first current lead wire is spaced apart from the third current lead wire by a second predetermined distance that is approximately equal to the first predetermined distance.

19. The system of claim 16, wherein the first current lead wire is arranged on a first substrate layer, the second current lead is arranged on a second substrate layer that is coupled to a first surface of the first substrate layer, and the third current lead is arranged on a third substrate layer that is coupled to a second surface of the first substrate layer opposite the first surface.

20. The system of claim 19, wherein the heater comprises:
a first heating element arranged on the first substrate layer; and
a second heating element arranged on the second substrate layer, wherein the input current is arranged to be conducted through the first heating element and through the second heating element by a first via interconnecting the first substrate layer and the second substrate layer;

wherein the system further comprises a second via that interconnects the third current lead wire on the third substrate layer to the second current lead wire on the second substrate layer through the first substrate layer.

\* \* \* \* \*